United States Patent
Yoo et al.

(10) Patent No.: US 9,276,014 B2
(45) Date of Patent: Mar. 1, 2016

(54) ARRAY SUBSTRATE AND METHOD OF FABRICATING THE SAME, AND LIQUID CRYSTAL DISPLAY DEVICE

(71) Applicant: BOE TECHNOLOGY GROUP CO., LTD., Beijing (CN)

(72) Inventors: Seongyeol Yoo, Beijing (CN); Youngsuk Song, Beijing (CN); Heecheol Kim, Beijing (CN); Seungjin Choi, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/852,810

(22) Filed: Sep. 14, 2015

(65) Prior Publication Data

US 2016/0013216 A1    Jan. 14, 2016

Related U.S. Application Data

(62) Division of application No. 14/555,790, filed on Nov. 28, 2014, now Pat. No. 9,165,830.

(30) Foreign Application Priority Data

Jun. 18, 2014   (CN) .......................... 2014 1 0272714

(51) Int. Cl.
| | |
|---|---|
| H01L 29/66 | (2006.01) |
| H01L 29/786 | (2006.01) |
| H01L 27/12 | (2006.01) |
| G02F 1/1362 | (2006.01) |
| G02F 1/1368 | (2006.01) |
| G02F 1/1343 | (2006.01) |
| H01L 29/24 | (2006.01) |
| H01L 23/522 | (2006.01) |
| H01L 23/31 | (2006.01) |

(52) U.S. Cl.
CPC .......... *H01L 27/1225* (2013.01); *G02F 1/1368* (2013.01); *G02F 1/13439* (2013.01); *G02F 1/136227* (2013.01); *G02F 1/136286* (2013.01); *H01L 23/3171* (2013.01); *H01L 23/5226* (2013.01); *H01L 27/124* (2013.01); *H01L 29/24* (2013.01); *H01L 29/7869* (2013.01)

(58) Field of Classification Search
CPC ... H01L 21/77; H01L 27/127; H01L 27/1288; H01L 27/1248
USPC ................................................. 257/59–60, 72
See application file for complete search history.

(56) References Cited

U.S. PATENT DOCUMENTS 8,852,975 B2 * 10/2014 Shin et al. ............. H01L 27/124
257/59

*Primary Examiner* — Cuong Q Nguyen
(74) *Attorney, Agent, or Firm* — Nath, Goldberg & Meyer; Joshua B. Goldberg (57) ABSTRACT

An array substrate, a method of fabricating the same, and a liquid crystal display device are disclosed. The method comprises: sequentially forming a first transparent conductive material layer, an insulation material layer, a semiconductor material layer and a photoresist layer on a substrate base and forming patterns including a gate line, a gate, a gate insulation layer, a semiconductor layer and a first transparent electrode by patterning process; forming a passivation layer and forming a source via and a drain via connected to the semiconductor layer in the passivation layer; sequentially forming a second transparent conductive material layer and a source-drain metal layer and forming patterns including a source, a drain and a second transparent electrode by patterning process, the gate insulation layer is formed only on the gate and the gate line, the source and the drain include stacked second transparent conductive material layer and source-drain metal layer.

20 Claims, 7 Drawing Sheets

ARRAY SUBSTRATE AND METHOD OF FABRICATING THE SAME, AND LIQUID CRYSTAL DISPLAY DEVICE

This is a Divisional Application of U.S. patent application Ser. No. 14/555,790, filed Nov. 28, 2014, an application claiming benefit from Chinese Application No. 201410272714.8, filed Jun. 18, 2014, the content of each of which is hereby incorporated by reference in its entirety.

FIELD OF THE INVENTION

The present invention relates to the field of liquid crystal display technology, and more particularly, to an array substrate, a method of fabricating the array substrate, and a liquid crystal display device.

BACKGROUND OF THE INVENTION

A liquid crystal display device of ADS mode (Advanced Super Dimension Switch mode) has advantages of wide viewing angle, high transmittance and high definition, thus the ADS mode becomes an important mode of the liquid crystal display device.

Figure 1:
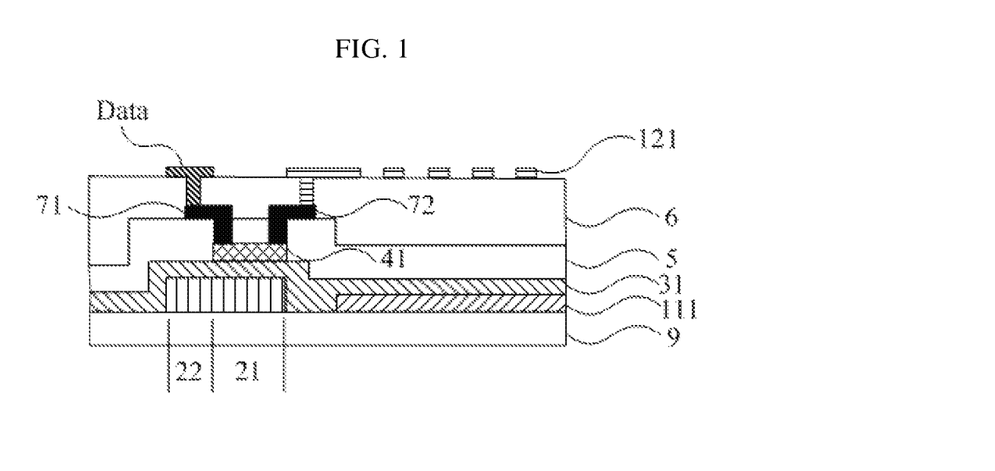
FIG. 1 is a cross-sectional structural view of an array substrate of ADS mode in the prior art.

As shown in FIG. 1, in an array substrate of the ADS mode, a first transparent electrode 111 of plate-shape, a gate 21 and a gate line 22 of a thin film transistor are provided on a substrate base 9, and a gate insulation layer 31 covers the first transparent electrode 111, the gate 21 and the gate line 22. A semiconductor layer 41 is provided above the gate 21, the semiconductor layer 41, an ohmic contact layer and a transition layer constitute an active region of the thin film transistor. A passivation layer 5 and a planarization layer 6 sequentially cover the semiconductor layer 41 and the gate insulation layer 31. A data line Data and a second transparent electrode 121 are provided on the planarization layer 6. The data line Data and the second transparent electrode 121 are electrically connected to a source 71 and a drain 72 of the thin film transistor, respectively. The second transparent electrode 121 is a slit-shaped electrode, and is provided above the first transparent electrode 111. It should be understood that, although a case in which the second transparent electrode 121 is a pixel electrode and the first transparent electrode 111 is a common electrode is taken as an example, but if the first transparent electrode 111 is the pixel electrode (i.e., is electrically connected to the drain 72), the second transparent electrode 121 may be the common electrode.

As shown in FIG. 1, in the array substrate of the ADS mode in prior art, the gate 21, the gate line 22, the semiconductor layer 41, the first transparent electrode 111, the source 71, the drain 72 and the second transparent electrode 121 are needed to be fabricated in different patterning processes, respectively, that is, photolithography is required to be performed at least six times so as to fabricate those structures. Therefore, the fabricating process is complex.

Meanwhile, the gate insulation layer 31 covers the whole substrate base 9, that is, the gate insulation layer 31 is also provided between the first transparent electrode 111 and the second transparent electrode 121, which increases a distance between the two electrodes and reduces an intensity of electric field and a capacitance, so that driving effect is deteriorated. On the other hand, the gate insulation layer 31 also affects light transmission, so that light transmittance of the array substrate is reduced.

SUMMARY OF THE INVENTION

In order to solve technical problems of complex fabricating process, poor driving effect and low light transmittance of the array substrate of the ADS mode in the prior art, the embodiments of the present invention provide an array substrate, a method of fabricating the array substrate, and a liquid crystal display device, which have advantages of simple fabricating process, good driving effect and high light transmittance.

The embodiments of the present invention provide a method of fabricating an array substrate, comprising: Step 1 of sequentially forming a first transparent conductive material layer, an insulation material layer, a semiconductor material layer and a photoresist layer on a substrate base and forming patterns including a gate line, a gate, a gate insulation layer, a semiconductor layer and a first transparent electrode by patterning process; Step 2 of forming a passivation layer on the substrate base and forming a source via and a drain via which are connected to the semiconductor layer in the passivation layer; and Step 3 of sequentially forming a second transparent conductive material layer and a source-drain metal layer on the substrate base and forming patterns including a source, a drain and a second transparent electrode by patterning process, wherein the gate insulation layer is formed only on the gate and the gate line, the source and the drain are electrically connected to the semiconductor layer through the source via and the drain via, respectively, and the source and the drain include the second transparent conductive material layer and the source-drain metal layer which are stacked.

The Step 1 may comprise steps of: sequentially forming the first transparent conductive material layer, the insulation material layer, the semiconductor material layer and a photoresist layer on the substrate base; performing a stepped exposure and a development on the photoresist layer, so that the photoresist layer with a first thickness is remained at a region corresponding to the gate, the photoresist layer with a second thickness is remained at a region corresponding to the gate line, the photoresist layer with a third thickness is remained at a region corresponding to the first transparent electrode, and no photoresist layer is remained at other region, the first thickness being larger than the second thickness, and the second thickness being larger than the third thickness; removing the semiconductor material layer, the insulation material layer and the first transparent conductive material layer in the region in which no photoresist layer is remained; removing the photoresist layer with the third thickness, so that the semiconductor material layer provided at the region corresponding to the first transparent electrode is exposed; removing the semiconductor material layer, the insulation material layer provided at the region corresponding to the first transparent electrode to form the pattern of the first transparent electrode; removing the photoresist layer remaining at the region corresponding to the gate line, so that the semiconductor material layer provided at the region corresponding to the gate line is exposed; removing the semiconductor material layer provided at the region corresponding to the gate line to form the pattern of the gate line; and removing the remaining photoresist layer to form the patterns of the gate, the gate insulation layer and the semiconductor layer.

The Step 3 may comprise steps of: forming the second transparent conductive material layer, the source-drain metal layer and a photoresist layer on the substrate base; performing a stepped exposure and a development on the photoresist layer, so that the photoresist layer with a fourth thickness is remained at regions corresponding to the source and the drain, the photoresist layer with a fifth thickness is remained at a region corresponding to the second transparent electrode, and no photoresist layer is remained at other region, the fourth thickness being larger than the fifth thickness; removing the second transparent conductive material layer and the source-drain metal layer provided at the region in which no photoresist layer is remained; removing the photoresist layer with the fifth thickness, so that the source-drain metal layer provided at the region corresponding to the second transparent electrode is exposed; removing the source-drain metal layer provided at the region corresponding to the second transparent electrode to form the pattern of the second transparent electrode; and removing the remaining photoresist layer to form the patterns of the source and the drain.

The semiconductor layer may be made of metal oxide semiconductor material.

In some embodiments, the first transparent electrode may be a common electrode; and the second transparent electrode may be a pixel electrode, the second transparent electrode and the second transparent conductive material layer of the drain are connected as a whole.

In other embodiments, the first transparent electrode may be a pixel electrode, and the second transparent electrode may be a common electrode; and the Step 2 may further comprise step of forming a via connected to the first transparent electrode in the passivation layer, the drain being electrically connected to the first transparent electrode through the via.

The embodiments of the present invention provide an array substrate, comprising a gate, a gate line, a gate insulation layer, a semiconductor layer, a first transparent electrode, a second transparent electrode, a source, a drain and a passivation layer, wherein the passivation layer covers the gate line, the gate, the gate insulation layer, the semiconductor layer and the first transparent electrode; the second transparent electrode is provided above the passivation layer; the source and the drain are provided above the passivation layer and are electrically connected to the semiconductor layer through a source via and a drain via provided in the passivation layer, respectively; the gate and the gate line comprise a first transparent conductive material layer, the first transparent conductive material layer is provided in the same layer as the first transparent electrode; the gate insulation layer is provided only on the gate and the gate line; and the source and the drain comprise a second transparent conductive material layer and a source-drain metal layer provided on the second transparent conductive material layer, the second transparent conductive material layer is provided in the same layer as the second transparent electrode.

The semiconductor layer may comprise metal oxide semiconductor.

In some embodiments, the second transparent electrode may be a pixel electrode, the second transparent electrode and the second transparent conductive material layer of the drain are connected as a whole; and the first transparent electrode may be a common electrode.

In other embodiments, the first transparent electrode may be a pixel electrode and is electrically connected to the drain through a via provided in the passivation layer; and the second transparent electrode may be a common electrode.

The embodiments of the present invention provide a liquid crystal display device, comprising the array substrate described above.

The "patterning process" comprises one or more steps of forming a film layer, applying photoresist, exposing, developing, etching and stripping off the photoresist, and portions of the film layer which are not needed may be removed by the above steps, so that the remaining portion of the film layer is formed as a desired pattern.

The "stepped exposure" refers to performing different degrees of exposure on different positions of a photoresist layer, so that the photoresist layer after a development has different thicknesses at the different positions, so as to complete subsequent patterning process.

Two structures being provided "in the same layer" means that the two structures are formed by performing a patterning process on a same complete layer, that is, the two structures were a single layer structure before the patterning process, and it does not mean that heights of the two structures are equal to each other.

In the method of fabricating the array substrate according to the embodiments of the present invention, the gate line, the gate, the gate insulation layer, the semiconductor layer and the first transparent electrode may be formed simultaneously in one patterning process, and the source, the drain and the second transparent electrode may be formed simultaneously in one patterning process. Therefore, the process which requires six exposures (6 Masks) in the prior art may be changed to require only two exposures (2 Masks) in the embodiments of the present invention, and thus the fabricating process becomes simple. Furthermore, both of the source and the drain are double-layer structure including metal layers, and thus have good conductivity. Meanwhile, since the gate insulation layer of the array substrate is formed only on the gate and the gate line, there is no gate insulation layer provided between the first transparent electrode and the second transparent electrode, so that the distance between the first transparent electrode and the second transparent electrode is short, the intensity of electric field is strong, the capacitance is large, the driving effect is good, and the gate insulation layer does not have an impact on the light transmission, and thus the light transmittance of the array substrate is high.

DESCRIPTION OF THE PREFERRED EMBODIMENT

Hereinafter, for the person skilled in the art to better understand the technical solutions of the present invention, the present invention will be described in detail with reference to the accompanying drawings and the exemplary embodiments.

First Embodiment

This embodiment provides a method of fabricating an array substrate, the method comprises following steps 1 through 3.

In the step 1, a first transparent conductive material layer, an insulation material layer, a semiconductor material layer and a photoresist layer are sequentially formed on a substrate base, and patterns including a gate line, a gate, a gate insulation layer, a semiconductor layer and a first transparent electrode are formed by patterning process, the gate insulation layer is formed only on the gate and the gate line.

In the step 2, a passivation layer is formed on the substrate base, and a source via and a drain via which are connected to the semiconductor layer are formed in the passivation layer.

In the step 3, a second transparent conductive material layer and a source-drain metal layer are sequentially formed on the substrate base, and patterns including a source, a drain and a second transparent electrode are formed by patterning process, the source and the drain are electrically connected to the semiconductor layer through the source via and the drain via, respectively, and the source and the drain include the second transparent conductive material layer and the source-drain metal layer which are stacked.

In the method of fabricating the array substrate according to the embodiment, the gate line, the gate, the gate insulation layer, the semiconductor layer and the first transparent electrode may be formed simultaneously in one patterning process, and the source, the drain and the second transparent electrode may be formed simultaneously in one patterning process. Therefore, the process which requires six exposures (6 Masks) in the prior art may be changed to require only two exposures (2 Masks) in the embodiment, and thus the fabricating process becomes simple. Furthermore, both of the source and the drain are double-layer structure including metal layers, and thus have good conductivity. Meanwhile, since the gate insulation layer of the array substrate is formed only on the gate and the gate line, there is no gate insulation layer provided between the first transparent electrode and the second transparent electrode, so that the distance between the first transparent electrode and the second transparent electrode is short, the intensity of electric field is strong, the capacitance is large, the driving effect is good, and the gate insulation layer does not have an impact on the light transmission, and thus the light transmittance is high.

Specifically, as shown in FIGS. 2 through 25, the method of fabricating the array substrate according to the embodiment comprises following steps S101 through S116.

In the step S101, a first transparent conductive material layer 11, an insulation material layer 3 and a semiconductor material layer 4 are sequentially formed on a substrate base 9, and a photoresist layer 8 is applied on the semiconductor material layer 4.

In this step, a gate metal layer 2 may be further formed between the first transparent conductive material layer 11 and the insulation material layer 3.

The first transparent conductive material layer 11 is made of material which is transparent and electrically conductive, such as indium tin oxide (ITO), and is used for forming a first transparent electrode 111, a gate 21 and a gate line 22.

The gate metal layer 2 is generally made of metal such as molybdenum or aluminum or alloy and is mainly used for forming the gate 21 and the gate line 22 together with the first transparent conductive material layer 11, thereby improving electrical conductivity of the gate 21 and the gate line 22.

It should be understood that, since the first transparent conductive material layer 11 is formed, the gate metal layer 2 may not be formed and the gate 21 and the gate line 22 may be formed by using only the first transparent conductive material layer 11. If the gate metal layer 2 is not formed in this step, operation of removing the metal gate layer 2 in subsequent steps will not be performed accordingly.

The insulation material layer 3 may be made of silicon nitride or silicon oxide and is mainly used for forming a gate insulation layer 31, so that the gate 21 is insulated from the semiconductor layer 41 and a motion interface of carriers is formed.

The semiconductor material layer 4 is made of semiconductor material and is mainly used for forming a semiconductor layer 41. For example, the semiconductor layer 41 (or the semiconductor material layer 4) is made of metal oxide semiconductor, such as indium gallium zinc oxide (IGZO), indium tin zinc oxide (ITZO) or zinc oxide (ZnO). Alternatively, the semiconductor layer 41 may be made of other semiconductor material such as poly-silicon or amorphous silicon.

In this step, the well-known structure such as buffer layer may be formed on the substrate base 9 in advance. Respective layers may be made of other well-known material. The method of forming the respective layers may be a well-known process such as sputtering, evaporation, chemical vapor deposition or coating. Since the above material, process and parameters for forming the respective layers are well known, the detailed description thereto will be omitted in the embodiment.

Figure 2:
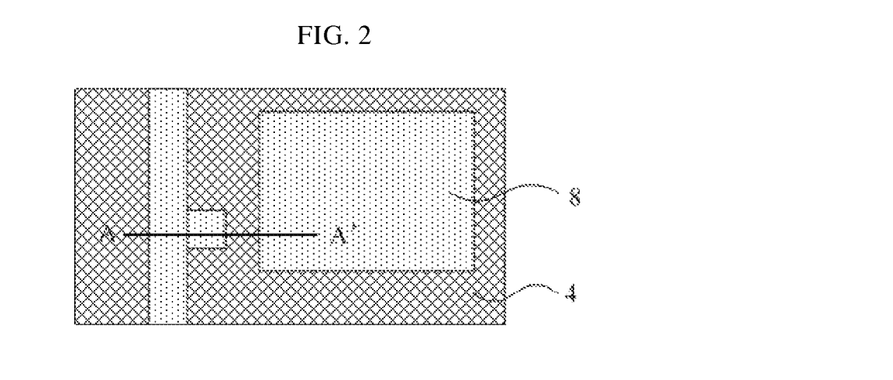
FIG. 2 is a top view of structures during a process of fabricating an array substrate according to the embodiments of the present invention.
Figure 3:
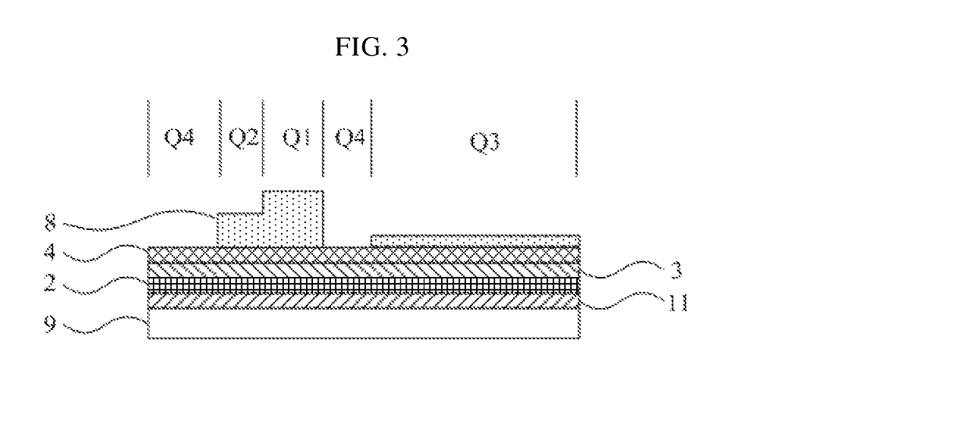
FIG. 3 is a cross-sectional structural view taken along a line A-A' of FIG. 2.

In the step S102, as shown in FIGS. 2 and 3, a stepped exposure and a development are performed on the photoresist layer 8, so that the photoresist layer 8 with a first thickness is remained at a gate position Q1 (a region corresponding to the gate), the photoresist layer 8 with a second thickness is remained at a gate line position Q2 (a region corresponding to the gate line), the photoresist layer 8 with a third thickness is remained at a first transparent electrode position Q3 (a region corresponding to the first transparent electrode), and no photoresist layer 8 is remained at other position Q4, the first thickness is larger than the second thickness, and the second thickness is larger than the third thickness.

That is, different degrees of exposure is performed on different positions of the photoresist layer 8, so that the photoresist layer 8 subjected to the development includes three portions with different thicknesses, and no photoresist layer 8 is remained at parts of the region above the semiconductor material layer 4, as shown in FIG. 3.

For example, the stepped exposure may be performed by using a gray scale mask or a halftone mask.

Figure 4:
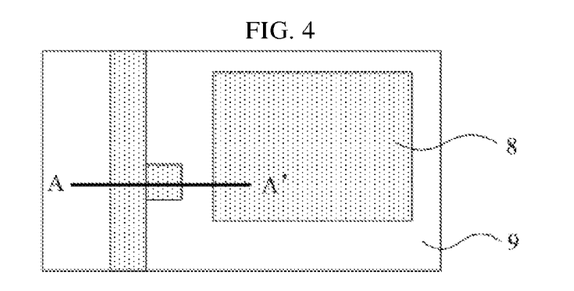
FIG. 4 is a top view of structures during the process of fabricating the array substrate according to the embodiments of the present invention.
Figure 5:
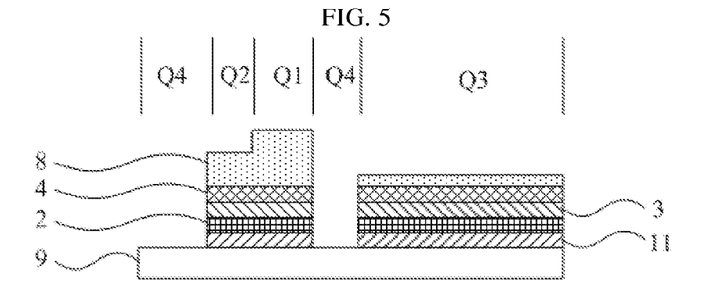
FIG. 5 is a cross-sectional structural view taken along a line A-A' of FIG. 4.

In the step S103, the semiconductor material layer 4, the insulation material layer 3, the gate metal layer 2 and the first transparent conductive material layer 11 in the region in which no photoresist layer is remained are removed, and structures shown in FIGS. 4 and 5 are obtained.

That is, the semiconductor material layer 4, the insulation material layer 3, the gate metal layer 2 and the first transparent conductive material layer 11 provided at the region Q4 in which no photoresist layer is remained are removed sequentially by etching, so that the first transparent conductive material layer 11 of the first transparent electrode region Q1 is separated from the first transparent conductive material layer 11 in other regions.

In this step, the etching may be performed by well-known methods, the plurality of the layers may be removed simultaneously in one etching process, or only one layer may be removed in each etching process, depending on the material of the layers and the etching process. Since the etching process and the parameters are well known, the detailed description thereto will be omitted in the embodiment.

Figure 6:
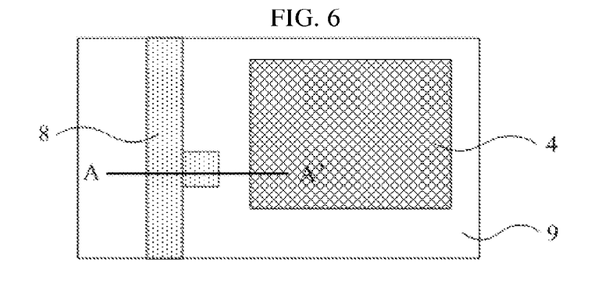
FIG. 6 is a top view of structures during the process of fabricating the array substrate according to the embodiments of the present invention.
Figure 7:
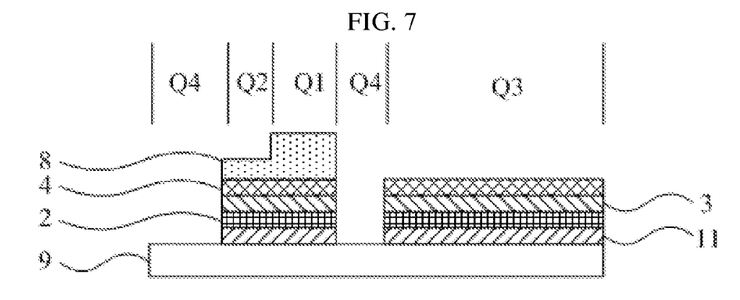
FIG. 7 is a cross-sectional structural view taken along a line A-A' of FIG. 6.

In the step S104, the photoresist layer 8 with the third thickness is removed, so that the semiconductor material layer 4 at the first transparent electrode position Q3 is exposed, and structures shown in FIGS. 6 and 7 are obtained.

That is, the photoresist layer 8 with the third thickness is removed by ashing process, so that the photoresist layer 8 at the first transparent electrode position Q3 is completely removed, the semiconductor material layer 4 at the first transparent electrode position Q3 is exposed, while the photoresist layer 8 at the gate position Q1 and the gate line position Q2 is only thinned accordingly, resulting in the structures shown in FIGS. 6 and 7.

In this step, areas of the photoresist layer 8 at the gate position Q1 and the gate line position Q2 are actually slightly reduced due to the characteristic of ashing process, but it does not have any substantial impact on the structure of final product, and thus it is not shown in the drawings.

Figure 8:
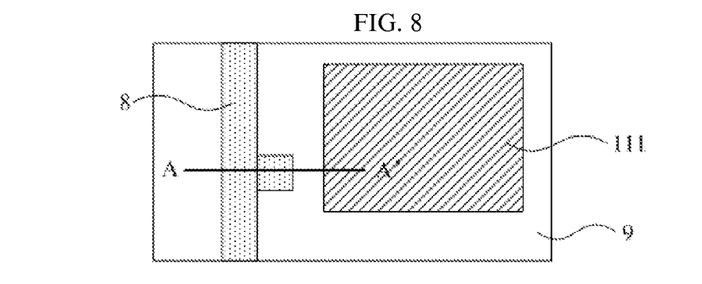
FIG. 8 is a top view of structures during the process of fabricating the array substrate according to the embodiments of the present invention.
Figure 9:
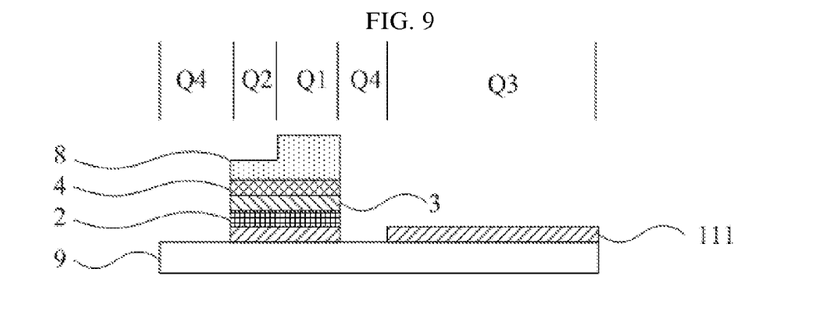
FIG. 9 is a cross-sectional structural view taken along a line A-A' of FIG. 8.

In the step S105, the semiconductor material layer 4, the insulation material layer 3 and the gate metal layer 2 provided at the first transparent electrode position Q3 are removed to form the pattern of the first transparent electrode 111 (plate-shape electrode), as shown in FIGS. 8 and 9.

In this step, since the photoresist layer 8 at the first transparent electrode position Q3 has been already removed, the semiconductor material layer 4, the insulation material layer 3 and the gate metal layer 2 provided at the first transparent electrode position Q3 may be sequentially removed by etching process, so that the first transparent conductive material layer 11 is exposed, thereby forming the first transparent electrode 111.

Figure 10:
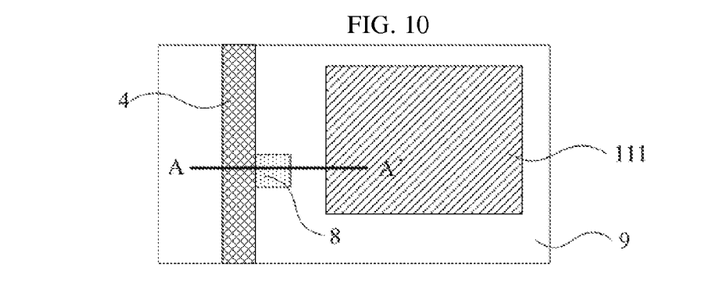
FIG. 10 is a top view of structures during the process of fabricating the array substrate according to the embodiments of the present invention.
Figure 11:
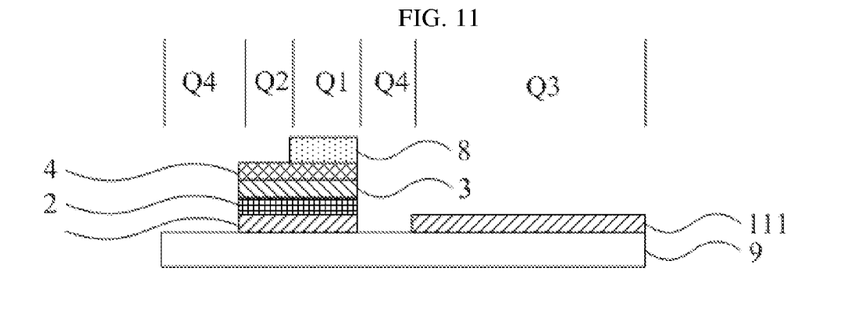
FIG. 11 is a cross-sectional structural view taken along a line A-A' of FIG. 10.

In the step S106, the photoresist layer 8 remaining at the gate line position Q2 is removed, so that the semiconductor material layer 4 at the gate line position Q2 is exposed, resulting in the structures shown in FIGS. 10 and 11.

That is, the photoresist layer 8 remaining at the gate line position Q2 (the thickness of which may be equal to the second thickness minus the third thickness) is removed by ashing process, so that the semiconductor material layer 4 at the gate line position Q2 is exposed, while the photoresist layer 8 at the gate position Q1 is further reduced, resulting in the structures shown in FIGS. 10 and 11.

Figure 12:
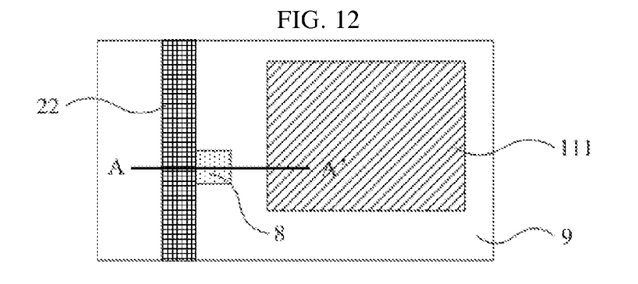
FIG. 12 is a top view of structures during the process of fabricating the array substrate according to the embodiments of the present invention.
Figure 13:
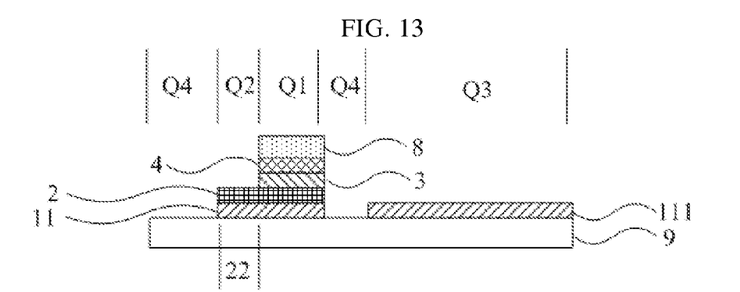
FIG. 13 is a cross-sectional structural view taken along a line A-A' of FIG. 12.

In the step S107, the semiconductor material layer 4 at the gate line position Q2 is removed and the insulation material layer 3 at the gate line position Q2 is also removed to form the pattern of the gate line 22, resulting in the structures shown in FIGS. 12 and 13.

That is, the semiconductor material layer 4 and the insulation material layer 3 at the gate line position Q2 are sequentially removed by etching process, so that the gate metal layer 2 is exposed, thereby forming the pattern of the gate line 22.

In this step, the insulation material layer 3 at the gate line position Q2 is also removed, so that the gate insulation layer 31 is not provided on the gate line 22 in the final product, the pattern of the gate insulation layer 31 coincides with the pattern of the semiconductor layer 41, and both of the gate insulation layer 31 and the semiconductor layer 41 are provided only on the gate 21. The advantage of this process is that the semiconductor material layer 4 and the insulation material layer 3 may be removed by using a certain etchant in one etching process, thereby simplifying the process.

It should be understood that, in this step, only the semiconductor material layer 4 at the gate line position Q2 may be removed, while the insulation material layer 3 is remained. Thus, in the final product, the gate insulation layer 31 is still provided on the gate line 22 (but the semiconductor layer 41 is provided only on the gate 21), the gate insulation layer 31 may increase the distance between the gate line 22 and the data line, thereby reducing the coupling capacitance between the gate line 22 and the data line.

In this step, the example in which the array substrate comprises the gate metal layer 2 is described in the embodiment, that is, the gate line 22 consists of the gate metal layer 2 and the first transparent conductive material layer 11, thereby improving the electrical conductivity of the gate line 22. It should be understood that, if the gate metal layer 2 is not formed in the step S101, only the first transparent conductive material layer 11 is remained at the gate line position Q2 in this case, that is, the gate line 22 may only consist of the transparent conductive material.

Meanwhile, in the embodiment, other structure such as a common electrode line may also be formed, and detailed description thereto will be omitted herein.

Figure 14:
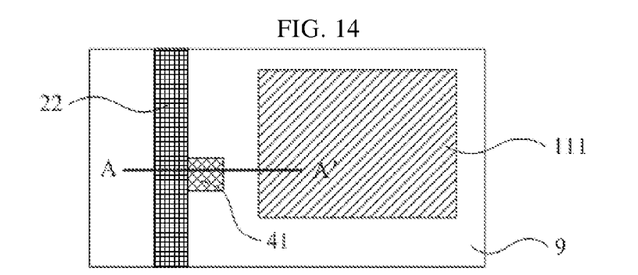
FIG. 14 is a top view of structures during the process of fabricating the array substrate according to the embodiments of the present invention.
Figure 15:
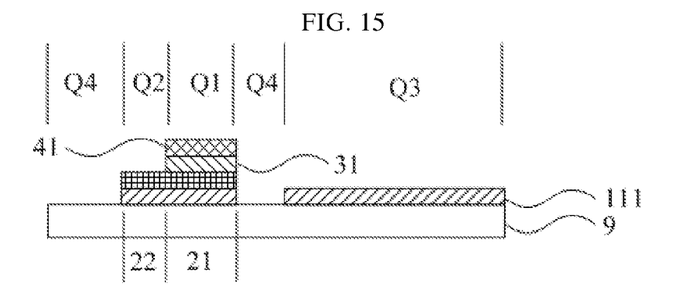
FIG. 15 is a cross-sectional structural view taken along a line A-A' of FIG. 14.

In the step S108, all remaining photoresist layer 8 is removed to form the patterns of the gate 21, the gate insulation layer 31 and the semiconductor layer 41, as shown in FIGS. 14 and 15.

That is, all remaining photoresist layer 8 (i.e., the photoresist layer 8 at the gate position Q1) is removed, so that the semiconductor material layer 4 is exposed, thereby forming the gate 21, the gate insulation layer 31 and the semiconductor layer 41.

As can be seen from the above, the patterns of the gate line 22, the gate 21, the gate insulation layer 31, the semiconductor layer 41 and the first transparent electrode 111 may be formed by only one exposure in the embodiment, and thus the number of exposures to be performed is significantly reduced and the fabricating process becomes simple.

Meanwhile, in the array substrate of the embodiment, the gate insulation layer 31 is formed only on the gate 21 and the gate line 22, that is, the gate insulation layer 31 is not provided between the first transparent electrode 111 and the second transparent electrode 121. Therefore, the distance between the first transparent electrode 111 and the second transparent electrode 121 is short, the intensity of electric field is strong, the capacitance is large, the driving effect is good, and the gate insulation layer 31 does not have an impact on the light transmission, and thus the light transmittance is high.

In the step S109, a passivation layer (PVX) 5 is formed, and a source via and a drain via connected to the semiconductor layer 41 are formed in the passivation layer 5.

The passivation layer 5 may be made of material such as silicon nitride or silicon oxide and is used for protecting the semiconductor layer 41, and the passivation layer 5 makes the first transparent electrode 111 to be separated from other structures provided above the passivation layer 5.

In the step S110, a second transparent conductive material layer 12, a source-drain metal layer 7 and a photoresist layer 8 are sequentially formed.

The second transparent conductive material layer 1 may be made of the same material as that of the first transparent conductive material layer 11, and the source-drain metal layer 7 may be made of the same material as that of the gate metal layer 2.

In the step S111, a stepped exposure and a development are performed on the photoresist layer 8, so that the photoresist layer with a fourth thickness is remained at a source position and a drain position (regions corresponding to the source and the drain), the photoresist layer with a fifth thickness is remained at a second transparent electrode position (a region corresponding to the second transparent electrode), and no photoresist layer is remained at other positions, the fourth thickness is larger than the fifth thickness.

Figure 16:
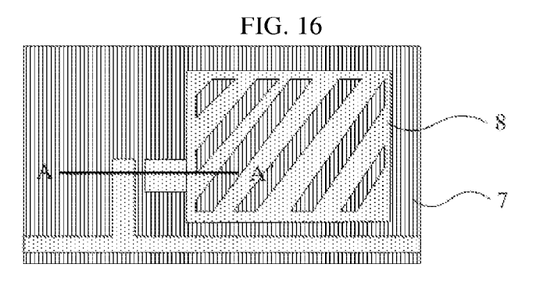
FIG. 16 is a top view of structures during the process of fabricating the array substrate according to the embodiments of the present invention.
Figure 17:
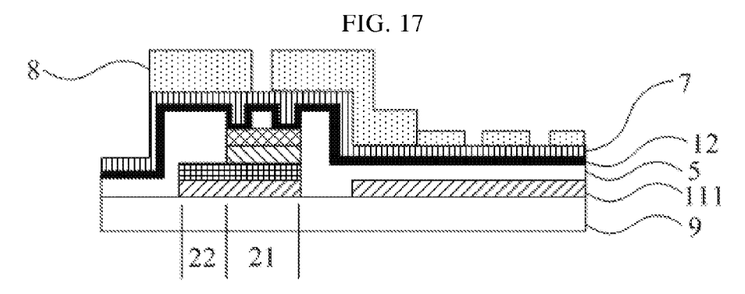
FIG. 17 is a cross-sectional structural view taken along a line A-A' of FIG. 16.

That is, the photoresist layer 8 is stepped exposed by using a gray scale mask or a halftone mask and then is developed, so that the photoresist layer 8 with a larger thickness is remained at the positions corresponding to the source and the drain, the photoresist layer 8 with a smaller thickness is remained at the position corresponding to the second transparent electrode 121, and no photoresist layer is remained at other positions, resulting in the structures shown in FIGS. 16 and 17.

It should be understood that, since the data line Data is connected to the source 71, the data line Data may be formed together with the source 71. If the data line Data is going to be formed, the photoresist layer with the larger thickness is also required to be remained at a position corresponding to the data line Data (i.e., the pattern of the source includes a portion of the data line Data).

In the step S112, the second transparent conductive material layer 12 and the source-drain metal layer 7 at the region in which no the photoresist layer is remained are removed.

Figure 18:
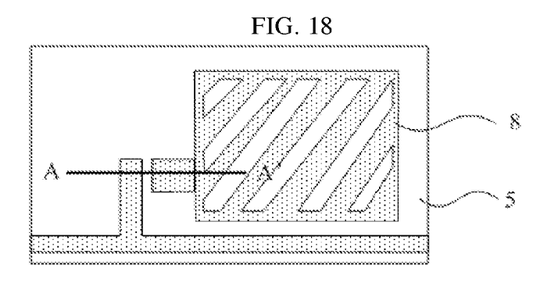
FIG. 18 is a top view of structures during the process of fabricating the array substrate according to the embodiments of the present invention.
Figure 19:
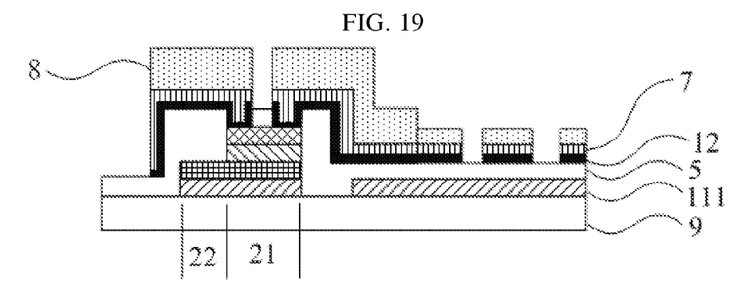
FIG. 19 is a cross-sectional structural view taken along a line A-A' of FIG. 18.

That is, the exposed second transparent conductive material layer 12 and source-drain metal layer 7 are removed by etching, resulting in the structures shown in FIGS. 18 and 19.

In the step S113, the photoresist layer 8 with the fifth thickness is removed, so that the source-drain metal layer 7 at the second transparent electrode position is exposed.

Figure 20:
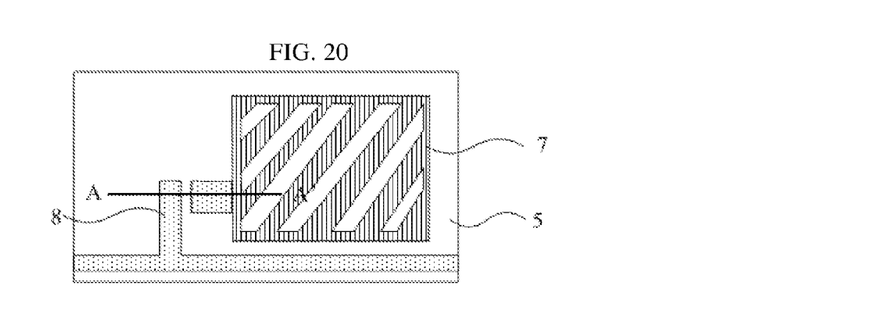
FIG. 20 is a top view of structures during the process of fabricating the array substrate according to the embodiments of the present invention.
Figure 21:
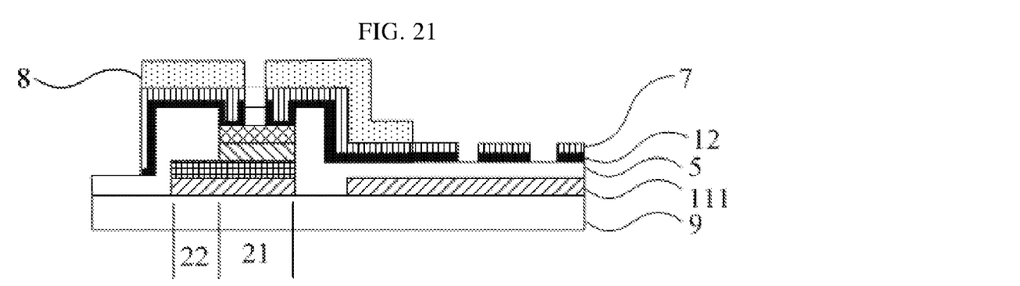
FIG. 21 is a cross-sectional structural view taken along a line A-A' of FIG. 20.

That is, the photoresist layer 8 at the second transparent electrode position is removed by ashing process, so that the source-drain metal layer 7 provided at the position is exposed, while the photoresist layer 8 at the positions corresponding to the source and the drain is thinned, resulting in the structures shown in FIGS. 20 and 21.

In the step S114, the source-drain metal layer 7 at the second transparent electrode position is removed to form the pattern of the second transparent electrode 121.

Figure 22:
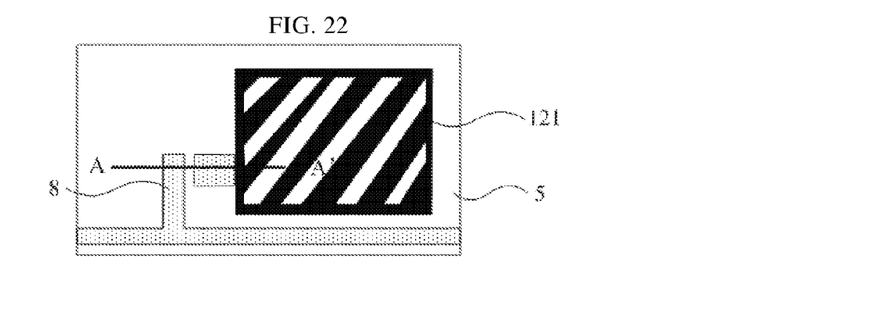
FIG. 22 is a top view of structures during the process of fabricating the array substrate according to the embodiments of the present invention.
Figure 23:
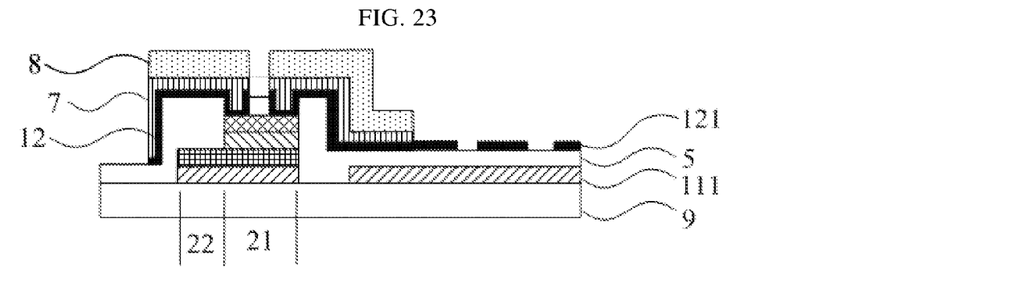
FIG. 23 is a cross-sectional structural view taken along a line A-A' of FIG. 22.

That is, the exposed source-drain metal layer 7 is removed, so that the remaining second transparent conductive material layer 12 is formed as the second transparent electrode 121, resulting in the structures shown in FIGS. 22 and 23. The second transparent electrode 121 is provided above the first transparent electrode 111 and is a slit-shaped electrode, thereby constituting the array substrate of ADS mode.

The second transparent electrode 121 and the second transparent conductive material layer of the drain 72 are connected as a whole, that is, the pattern of the second transparent electrode 121 and the pattern of the second transparent conductive material layer of the drain are formed integrally, and the two patterns are not disconnected from each other. Therefore, the second transparent electrode 121 is the pixel electrode, and accordingly, the first transparent electrode 111 is the common electrode.

In the step S115, the remaining photoresist layer 8 is removed to form the patterns of the source 71 and the drain 72.

Figure 24:
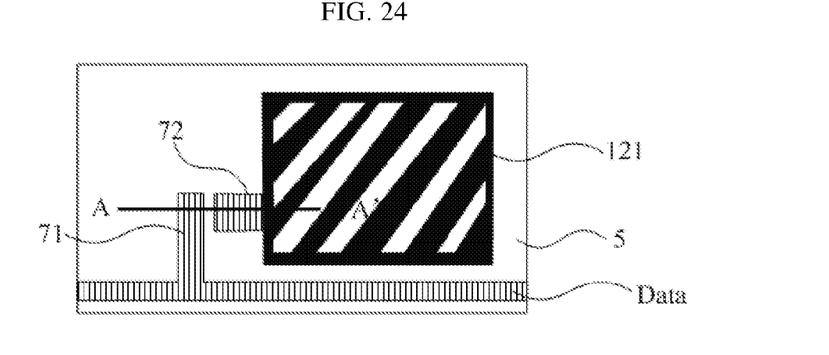
FIG. 24 is a top view of structures during the process of fabricating the array substrate according to the embodiments of the present invention.
Figure 25:
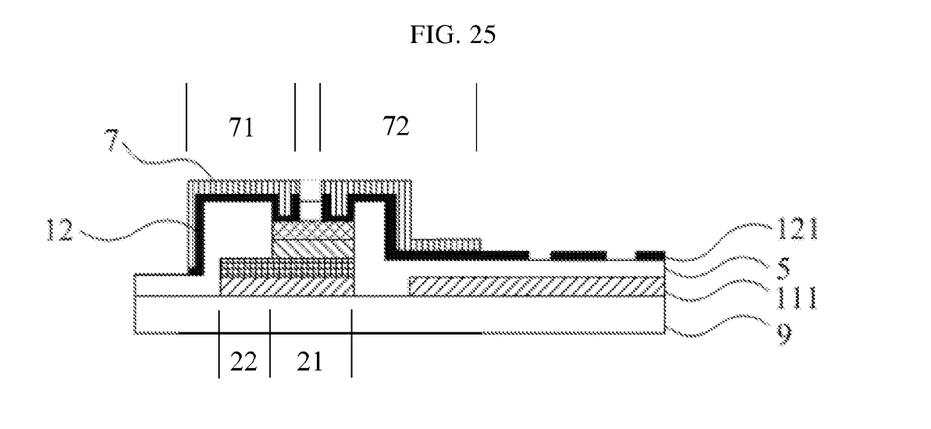
FIG. 25 is a cross-sectional structural view taken along a line A-A' of FIG. 24.

That is, the remaining photoresist layer 8 at the positions corresponding to the source 71 and the drain 72 is removed, so that the remaining second transparent conductive material layer 12 and source-drain metal layer 7 provided at the positions are formed as the source 71 and the drain 72 (while the data line Data may also be formed), resulting in the array substrates shown in FIGS. 24 and 25.

In the embodiment, the source 71, the drain 72 and the second transparent electrode 121 may be formed by one photolithographic process, so that the fabricating process is simple. Meanwhile, both of the source 71 and the drain 72 consist of the second transparent conductive material layer 12 and the source-drain metal layer 7 which are stacked. Since the electrical conductivity of the source-drain metal layer 7 is good, the electrical conductivity of the source 71 and the drain 72 is also good.

In the step S116, other well-known structures (not illustrated in the drawings) such as alignment film are further formed to complete fabrication of the array substrate.

Figure 26:
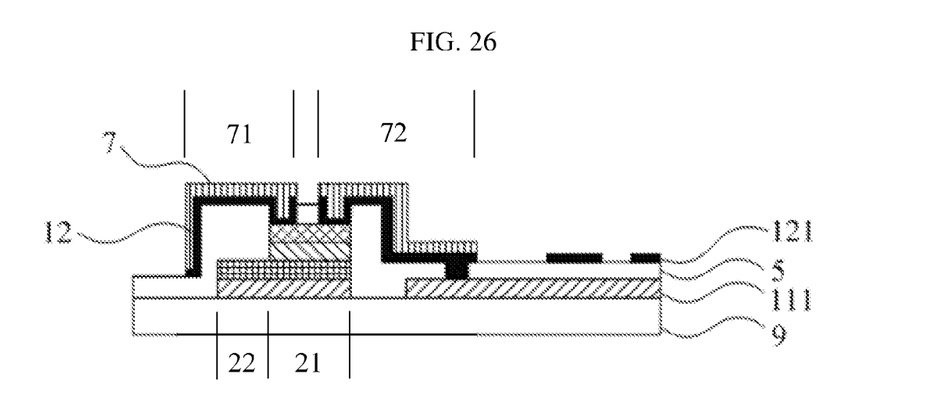
FIG. 26 is a cross-sectional structural view of an array substrate according to other embodiments of the present invention.

In the embodiment, an example in which the first transparent electrode 111 is the common electrode and the second transparent electrode 121 is the pixel electrode is described. It should be understood that, as another aspect of the embodiments of the present invention, the first transparent electrode 111 may be the pixel electrode, and the second transparent electrode 121 may be the common electrode. In this case, the structures of the array substrate are shown in FIG. 26, the drain 72 (i.e., the second transparent conductive material layer 12 of the drain 72) is connected to the first transparent electrode 111 through a via provided in the passivation layer 5, while the pattern of the second transparent electrode 121 is disconnected from the second transparent conductive material layer 12 of the drain 72. When fabricating this kind of array substrate, a via for connecting the drain 72 with the first transparent electrode 111 is required to be formed in the passivation layer 5, and the pattern of the second transparent electrode 121 is required to be changed.

It should be understood that the array substrate in the above embodiment may be modified in several manners.

For example, a planarization layer may be further formed after forming the source and the drain, the planarization layer may be made of material such as resin and is mainly used for offsetting height differences generated due to structures such as the thin film transistor, so that the overall surface of the array substrate is almost flat, so as to uniformly form the film layer of the alignment film in subsequent process, and facilitate uniform rubbing of rubbing-alignment process.

Alternatively, the planarization layer may be formed immediately after forming the passivation layer, so that the source, the drain and the second transparent electrode may be formed on the planarization layer.

Furthermore, the data line and the common electrode line may be formed in other steps.

Second Embodiment

As shown in FIGS. 25 and 26, this embodiment provides an array substrate fabricated by the method described above, comprising a gate 21, a gate line 22, a gate insulation layer 31, a semiconductor layer 41, a first transparent electrode 111, a second transparent electrode 121, a source 71, a drain 72, and a passivation layer 5.

The passivation layer 5 covers the gate line 22, the gate 21, the gate insulation layer 31, the semiconductor layer 41 and the first transparent electrode 111.

The second transparent electrode 121 is provided above the passivation layer 5.

The source 71 and the drain 72 are provided above the passivation layer 5 and are electrically connected to the semiconductor layer 41 through a source via and a drain via provided in the passivation layer 5, respectively.

The gate 21 and the gate line 22 comprise a first transparent conductive material layer 11, the first transparent conductive material layer 11 is provided in the same layer as the first transparent electrode 111.

The gate insulation layer 31 is provided only on the gate 21 and the gate line 22.

The source 71 and the drain 72 comprise a second transparent conductive material layer 12 and a source-drain metal layer 7 provided on the second transparent conductive material layer 12, the second transparent conductive material layer 12 is provided in the same layer as the second transparent electrode 121.

The semiconductor layer 41 may be made of metal oxide semiconductor.

The second transparent electrode 121 may be a pixel electrode, the second transparent electrode 121 and the second transparent conductive material layer 12 of the drain 72 are connected as a whole, and the first transparent electrode 111 may be a common electrode.

Alternatively, the first transparent electrode 111 may be the pixel electrode and is electrically connected to the drain 72 through a via provided in the passivation layer, and the second transparent electrode 121 may be the common electrode.

The array substrate of the embodiment may further comprise other well-known structures such as a common electrode line, a data line and an alignment film, and the detailed description thereto is omitted herein.

Third Embodiment

This embodiment provides a liquid crystal display device comprising the array substrate described above. The liquid crystal display device may be applicable to liquid crystal display panels, electronic papers, cell phones, tablet computers, TV, displays, laptops, digital photo frames, navigation systems and any other product or component that has a display function.

The liquid crystal display device of the embodiment comprises the array substrate described above, and has advantages of simple fabricating method, good driving effect and high light transmittance.

It should be appreciated that the above embodiments are only the exemplary embodiments employed for illustrating the principle of the present invention, but the present invention is not limited thereto. It will be apparent to those skilled in the art that modifications and variations can be made without departing from the spirit and scope of the present invention, and these modifications and variations are also considered to fall within the scope of protection of the present invention.

The invention claimed is:

1. An array substrate, comprising a gate, a gate line, a gate insulation layer, a semiconductor layer, a first transparent electrode, a second transparent electrode, a source, a drain and a passivation layer, wherein
the passivation layer covers the gate line, the gate, the gate insulation layer, the semiconductor layer and the first transparent electrode;
the second transparent electrode is provided above the passivation layer;
the source and the drain are provided above the passivation layer and are electrically connected to the semiconductor layer through a source via and a drain via provided in the passivation layer, respectively;
the gate and the gate line comprise a first transparent conductive material layer, the first transparent conductive material layer is provided in the same layer as the first transparent electrode;
the gate insulation layer is provided between the gate and the semiconductor layer and is not provided between the first transparent electrode and the second transparent electrode; and
the source and the drain comprise a second transparent conductive material layer and a source-drain metal layer provided on the second transparent conductive material layer, the second transparent conductive material layer is provided in the same layer as the second transparent electrode.

2. The array substrate of claim 1, wherein
the semiconductor layer comprises metal oxide semiconductor.

3. The array substrate of claim 1, wherein
the second transparent electrode is a pixel electrode, the second transparent electrode and the second transparent conductive material layer of the drain are connected as a whole; and
the first transparent electrode is a common electrode.

4. The array substrate of claim 1, wherein
the first transparent electrode is a pixel electrode and is electrically connected to the drain through a via provided in the passivation layer; and
the second transparent electrode is a common electrode.

5. The array substrate of claim 1, wherein
a pattern of the gate insulation layer coincides with a pattern of the semiconductor layer.

6. The array substrate of claim 5, wherein
both of the gate insulation layer and the semiconductor layer are provided only on the gate.

7. The array substrate of claim 1, wherein
the gate insulation layer is further provided on the gate line.

8. The array substrate of claim 1, wherein
the gate and the gate line further comprise a gate metal layer provided between the first transparent conductive material layer and the gate insulation layer.

9. The array substrate of claim 8, wherein
a pattern of the gate metal layer coincides with a pattern of the first transparent conductive material layer.

10. The array substrate of claim 1, wherein
an edge of the gate, an edge of the gate insulation layer and an edge of the semiconductor layer are aligned with each other.

11. A liquid crystal display device, comprising an array substrate, the array substrate comprising a gate, a gate line, a gate insulation layer, a semiconductor layer, a first transparent electrode, a second transparent electrode, a source, a drain and a passivation layer, wherein
the passivation layer covers the gate line, the gate, the gate insulation layer, the semiconductor layer and the first transparent electrode;
the second transparent electrode is provided above the passivation layer;
the source and the drain are provided above the passivation layer and are electrically connected to the semiconductor layer through a source via and a drain via provided in the passivation layer, respectively;
the gate and the gate line comprise a first transparent conductive material layer, the first transparent conductive material layer is provided in the same layer as the first transparent electrode;
the gate insulation layer is provided between the gate and the semiconductor layer and is not provided between the first transparent electrode and the second transparent electrode; and
the source and the drain comprise a second transparent conductive material layer and a source-drain metal layer provided on the second transparent conductive material layer, the second transparent conductive material layer is provided in the same layer as the second transparent electrode.

12. The liquid crystal display device of claim 11, wherein the semiconductor layer comprises metal oxide semiconductor.

13. The liquid crystal display device of claim 11, wherein
the second transparent electrode is a pixel electrode, the second transparent electrode and the second transparent conductive material layer of the drain are connected as a whole; and
the first transparent electrode is a common electrode.

14. The liquid crystal display device of claim 11, wherein
the first transparent electrode is a pixel electrode and is electrically connected to the drain through a via provided in the passivation layer; and
the second transparent electrode is a common electrode.

15. The liquid crystal display device of claim 11, wherein
a pattern of the gate insulation layer coincides with a pattern of the semiconductor layer.

16. The liquid crystal display device of claim 15, wherein both of the gate insulation layer and the semiconductor layer are provided only on the gate.

17. The liquid crystal display device of claim 11, wherein the gate insulation layer is further provided on the gate line.

18. The liquid crystal display device of claim 11, wherein the gate and the gate line further comprise a gate metal layer provided between the first transparent conductive material layer and the gate insulation layer.

19. The liquid crystal display device of claim 18, wherein a pattern of the gate metal layer coincides with a pattern of the first transparent conductive material layer.

20. The liquid crystal display device of claim 11, wherein an edge of the gate, an edge of the gate insulation layer and an edge of the semiconductor layer are aligned with each other.

* * * * *